(12) United States Patent
Rand et al.

(10) Patent No.: US 8,592,680 B2
(45) Date of Patent: Nov. 26, 2013

(54) ORGANIC PHOTOSENSITIVE DEVICES

(75) Inventors: Barry P. Rand, Princeton, NJ (US); Stephen R. Forrest, Princeton, NJ (US)

(73) Assignee: The Trustees of Princeton University, Princeton, NJ (US)

(*) Notice: Subject to any disclaimer, the term of this patent is extended or adjusted under 35 U.S.C. 154(b) by 1859 days.

(21) Appl. No.: 10/915,410

(22) Filed: Aug. 11, 2004

(65) Prior Publication Data

US 2006/0032529 A1   Feb. 16, 2006

(51) Int. Cl.
*H01L 31/00* (2006.01)

(52) U.S. Cl.
USPC .......................................... 136/263; 136/256

(58) Field of Classification Search
USPC ................... 136/263, 256; 522/81; 428/403
See application file for complete search history.

(56) References Cited

U.S. PATENT DOCUMENTS

| | | | |
|---|---|---|---|
| 5,703,436 A | 12/1997 | Forrest et al. | |
| 6,097,147 A | 8/2000 | Baldo et al. | |
| 6,239,355 B1* | 5/2001 | Salafsky | 136/250 |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans | |
| 6,441,945 B1* | 8/2002 | Atwater et al. | 359/296 |
| 6,451,415 B1 | 9/2002 | Forrest et al. | |
| 6,580,027 B2 | 6/2003 | Forrest et al. | |
| 6,657,378 B2 | 12/2003 | Forrest et al. | |
| 6,685,986 B2* | 2/2004 | Oldenburg et al. | 427/214 |
| 2002/0045675 A1* | 4/2002 | Halas et al. | 522/81 |
| 2002/0187347 A1* | 12/2002 | Halas et al. | 428/403 |
| 2002/0197462 A1* | 12/2002 | Forrest et al. | 428/212 |
| 2003/0042846 A1 | 3/2003 | Forrest et al. | |

FOREIGN PATENT DOCUMENTS

EP    1 538 679 A1    8/2005

OTHER PUBLICATIONS

Zhao et al., "Effects of the incorporation of silver and gold nanoparticles on the photoanodic properties of rose bengal sensitized TiO2 film electrodes prepared by sol-gel method", Solar Energy Materials and Solar Cells, vol. 46, 1997, pp. 219-231.*

Peumans et al., "Small molecular weight organic thin-film photodetectors and solar cells", Journal of Applied Physics, vol. 93, No. 7, pp. 3693-3723, Apr. 1, 2003.

Wittmann et al., "Optical spectroscopy of platinum and palladium containing poly-ynes", J. Chem. Phys., vol. 101, No. 4, pp. 2693-2698, Aug. 15, 1994.

Etchegoin et al., "Electromagnetic contribution to surface enhanced Raman scattering revisited", Journal of Chemical Physics, vol. 119, No. 10, pp. 5281-5289, Sep. 8, 2003.

Hiramoto et al., "Effect of thin gold interstitial-layer on the photovoltaic properties of tandem organic solar cell", Chemistry Letters, pp. 327-330, 1990.

(Continued)

*Primary Examiner* — Jonathan Johnson
*Assistant Examiner* — Thanh-Truc Trinh
(74) *Attorney, Agent, or Firm* — Duane Morris LLP

(57) ABSTRACT

The present invention generally relates to organic photosensitive optoelectronic devices. More specifically, it is directed to organic photosensitive optoelectronic devices having a photoactive organic region containing encapsulated nanoparticles that exhibit plasmon resonances. An enhancement of the incident optical field is achieved via surface plasmon polariton resonances. This enhancement increases the absorption of incident light, leading to a more efficient device.

23 Claims, 15 Drawing Sheets

(56) References Cited

OTHER PUBLICATIONS

C. Wen et al., "Effects of silver particles on the photovoltaic properties of dye-sensitized TiO2 thin films", Solar Energy Materials & Solar Cells 61, pp. 339-351, 2000.

Ung et al., "Optical properties of thin films of Au@SiO2 particles", J. Phys. Chem. B, 2001, 105, pp. 3441-3452.

B. Maennig, et al., "Organic p-i-n solar cells", Appl. Phys. A 79, pp. 1-14, 2004.

Gary L. Miessler, et al., *Inorganic Chemistry*, 2nd Edition, Prentice-Hall (1998), pp. 1-3, 422-424, 442. [Aug. 1999 version].

Andrew et al., "Surface-plasmon energy gaps and photoabsorption", J. Modern Optics, Taylor & Francis Ltd., UK vol. 44, No. 2: 395-406, 1997.

International Search Report dated Feb. 23, 2006, Application No. PCT/US2005/027887.

Link et al., "Alloy formation of gold-silver nanoparticles and the dependence of the plasmon absorption on their composition", J. Phys. Chem. B, American Chemical Society, USA vol. 103, No. 18: 3529-3533, 1999.

<http://www.oksolar.com/solar_panels/unisolar_flexibles.htm>, "Uni-solar Flexible (USF) Unbreakable Solar Panels—Triple Junction", printed Sep. 14, 2004.

"Uni-Power Solar Electric Modules Specification Sheet, Models US-64, US-42, US-32", printed from the OKSolar.com website on Sep. 14, 2004 <http://www.oksolar.com/pdf/solar_energy_catalog/unisolar_us-64.pdf>.

"Amorphous Silicon (a-Si) Solar Technology", printed from United Solar Ovonic Corp. website on Sep. 14, 2004, <http://www.uni-solar.com/Our_Technology_a_Si.html>.

S. Guha, et al., "Amorphous Silicon Alloy Photovoltaic Research Present and Future", Progress in Photovoltaics: Research and Applications, Prog. Photovolt. Res. Appl. 8, pp. 141-150 (2000).

Tang, "Two-Layer Organic Photovoltaic Cell," Appl. Phys. Lett., vol. 48, pp. 183 (1986).

Stenzel et al., "Enhancement of the Photovoltaic Conversion Efficiency of Copper Phthalocyanine Thing Film Devices by Incorporation of Metal Clusters," Solar Energy Materials & Solar Cells, vol. 37, pp. 337-348 (1995).

Ihara et al., "Enhancement of the Absorption Coefficient of cis-(NCS)2 Bis (2,2'-bipyridyl-4,4'-dicarboxylate)ruthenium(II) Dye in Dye-Sensitized Solar Cells by a Silver Island Film," J. Phys. Chem. B, vol. 101, pp. 5153-5157 (1997).

Westphalen et al., "Metal Cluster Enhanced Organic Solar Cells," Solar Energy Materials & Solar Cells, vol. 61, pp. 97-105 (2000).

Peumans et al., "Efficient Photon Harvesting at High Optical Intensities in Ultrathin Organic Double-Heterostructure Photovoltaic Diodes," Appl. Phys. Lett., vol. 76, pp. 2650-2652 (2000).

Ung et al., "Optical Properties of Thin Films of Au@Sio2 Particles," J. Phys. Chem. B, vol. 105, pp. 3441-3452 (2001).

Yakimov et al., "High Photovoltage Multiple-Heterojunction Organic Solar Cells Incorporating Interfacial Metallic Nanoclusters," Appl Phy Lett, vol. 80, No. 9, pp. 1667 (2002).

Salgueirino-Maceira et al., "Coated Colloids with Tailored Optical Properties," J. Phys. Chem. B, vol. 107, pp. 10990-10994 (2003).

Liz-Marzan et al., "The Assembly of Coated Nanocrystals," J. Phys. Chem. B, vol. 107, pp. 7312-7326 (2003).

Forrest et al., Multilayer Organic Photodetectors with Improved Performance, U.S. Appl. No. 10/723,953, filed Nov. 26, 2003.

Peumans et al., "Aperiodic Dielectric Multilayer Stakc," U.S. Appl. No. 10/857,747, filed Jun. 1, 2004.

Office Action issued for related Japanese Application No. 2007-525679 dated Jul. 28, 2011.

* cited by examiner

ORGANIC PHOTOSENSITIVE DEVICES

GOVERNMENT FUNDING

This invention was made with government support under grant number ACQ-1-30619-05 from the Department of Energy and grant number FA9550-011-0120 from the Air Force Office of Scientific Research. The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, University of Southern California, Global Photonic Energy Corporation, and the Universal Display Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having nanoparticles.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, $ff$.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, $ff$, defined as:

$$ff=\{I_{max}V_{max}\}/\{I_{SC}V_{OC}\} \quad (1)$$

where $ff$ is always less than 1, as $I_{SC}$ and $V_{OC}$ are never obtained simultaneously in actual use. Nonetheless, as $ff$ approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu \Rightarrow S_0^*$. Here $S_0$ and $S_0^*$ denote ground and excited molecular states, respectively. This energy absorption is associated with the promotion of an electron from a bound state in the HOMO energy level, which may be a $\pi$-bond, to the LUMO energy level, which may be a $\pi^*$-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free, energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for exciton diffusion, CC for charge collection, and INT for internal quantum efficiency. Using this notation:

$$\eta_P \sim \eta_{EXT} = \eta_A {}^* \eta_{ED} {}^* \eta_{CC}$$

$$\eta_{EXT} = \eta_A {}^* \eta_{INT}$$

The diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

Through the use of an organometallic material in the photoactive region, the devices of the present invention may efficiently utilize triplet excitons. It is believed that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

SUMMARY OF THE INVENTION

The present invention generally relates to organic photosensitive optoelectronic devices. More specifically, it is directed to organic photosensitive optoelectronic devices having a photoactive organic region containing encapsulated nanoparticles that exhibit plasmon resonances. An enhancement of the incident optical field is achieved via surface plasmon polariton resonances. This enhancement increases the absorption of incident light, leading to a more efficient device.

DETAILED DESCRIPTION

An organic photosensitive optoelectronic device is provided. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 1:
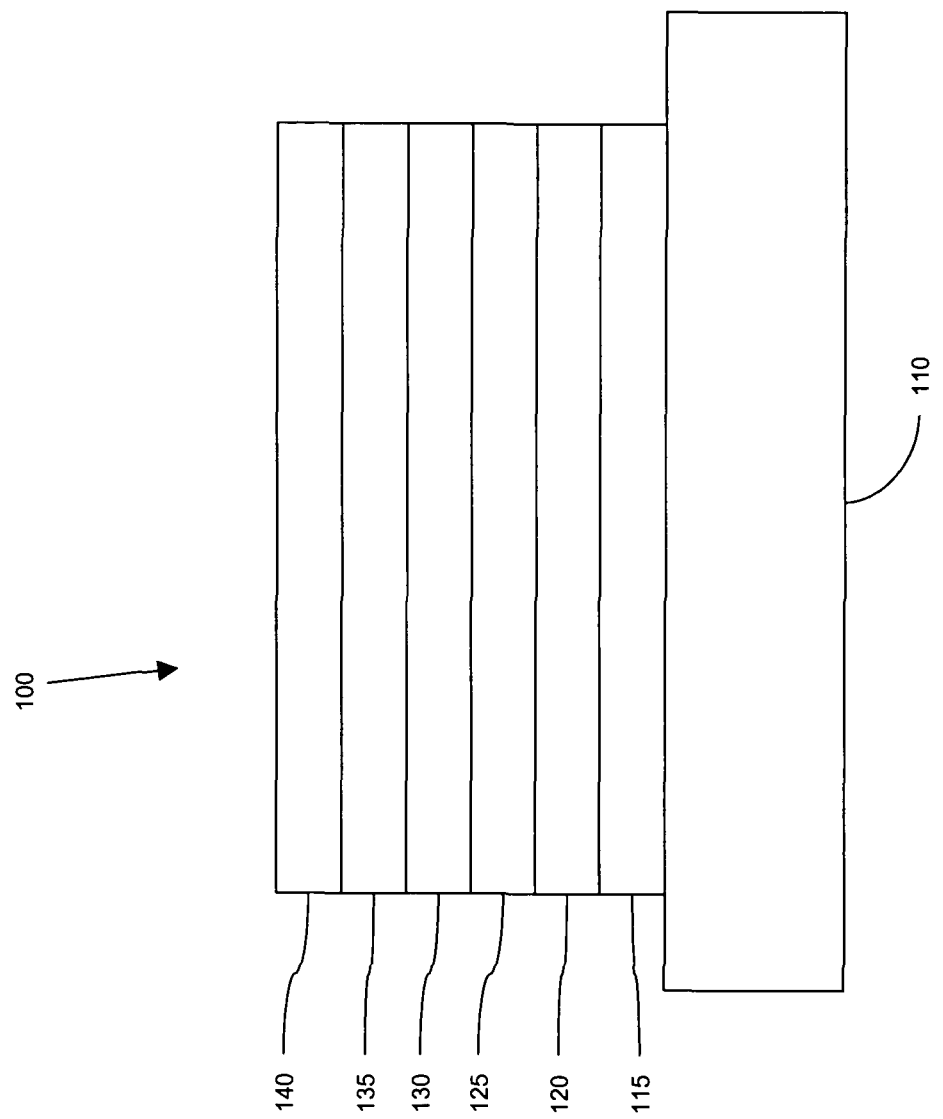
FIG. 1 shows an organic PV device.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The substrate may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

U.S. Pat. No. 6,352,777, incorporated herein by reference, provides examples of electrodes, or contacts, that may be used in a photosensitive optoelectronic device. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. Pat. No. 6,420,031, to Parthasarathy et al. ("Parthasarathy '031"), or a highly efficient, low resistance metallic/non-metallic compound cathode such as disclosed in U.S. Pat. No. 5,703,436 to Forrest et al. ("Forrest '436"), both incorporated herein by reference in their entirety. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photo-conducting material, which is equivalent to electrons moving in the opposite manner. It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

In a preferred embodiment of the invention, the stacked organic layers include one or more exciton blocking layers (EBLs) as described in U.S. Pat. No. 6,097,147, Peumans et al, *Applied Physics Letters* 2000, 76, 2650-52, and co-pending application Ser. No. 09/449,801, filed Nov. 26, 1999, both incorporated herein by reference. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO energy level closely matching the LUMO energy level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the acceptor layer and the cathode. A preferred material for the EBL comprises 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III)phenolate ($Alq_2OPH$). BCP is an effective exciton blocker which can easily transport electrons to the cathode from an acceptor layer.

The EBL layer may be doped with a suitable dopant, including but not limited to 3,4,9,10-perylenetracarboxylic dianhydride (PTCDA), 3,4,9,1 0-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticle or nanorods as described in U.S. Pat. No. 6,657,378, incorporated herein by reference in its entirety.

In another preferred embodiment of the invention, an anode-smoothing layer is situated between the anode and the donor layer. A preferred material for this layer comprises a film of 3,4-polyethylenedioxythiophene:polystyrenesulfonate (PEDOT:PSS). The introduction of the PEDOT:PSS layer between the anode (ITO) and the donor layer (CuPc) may lead to greatly improved fabrication yields. This is attributed to the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Preferred organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, spin coating, organic vapor-phase deposition, inkjet printing and other methods known in the art.

Organic photosensitive optoelectronic devices of embodiments of the present invention may function as a PV, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

The organic photosensitive optoelectronic devices of the present invention may function as photodetectors. In this embodiment, the device may be a multilayer organic device, for example as described in U.S. application Ser. No. 10/723,953, filed Nov. 26, 2003, incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. Nos. 6,333,458 and 6,440,769, incorporated herein by reference in their entirety, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333, 458 and 6,440,769 therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

Coatings may be used to focus optical energy into desired regions of a device. U.S. patent application Ser. No. 10/857, 747, which is incorporated by reference in its entirety, provides examples of such a coating.

Figure 2:
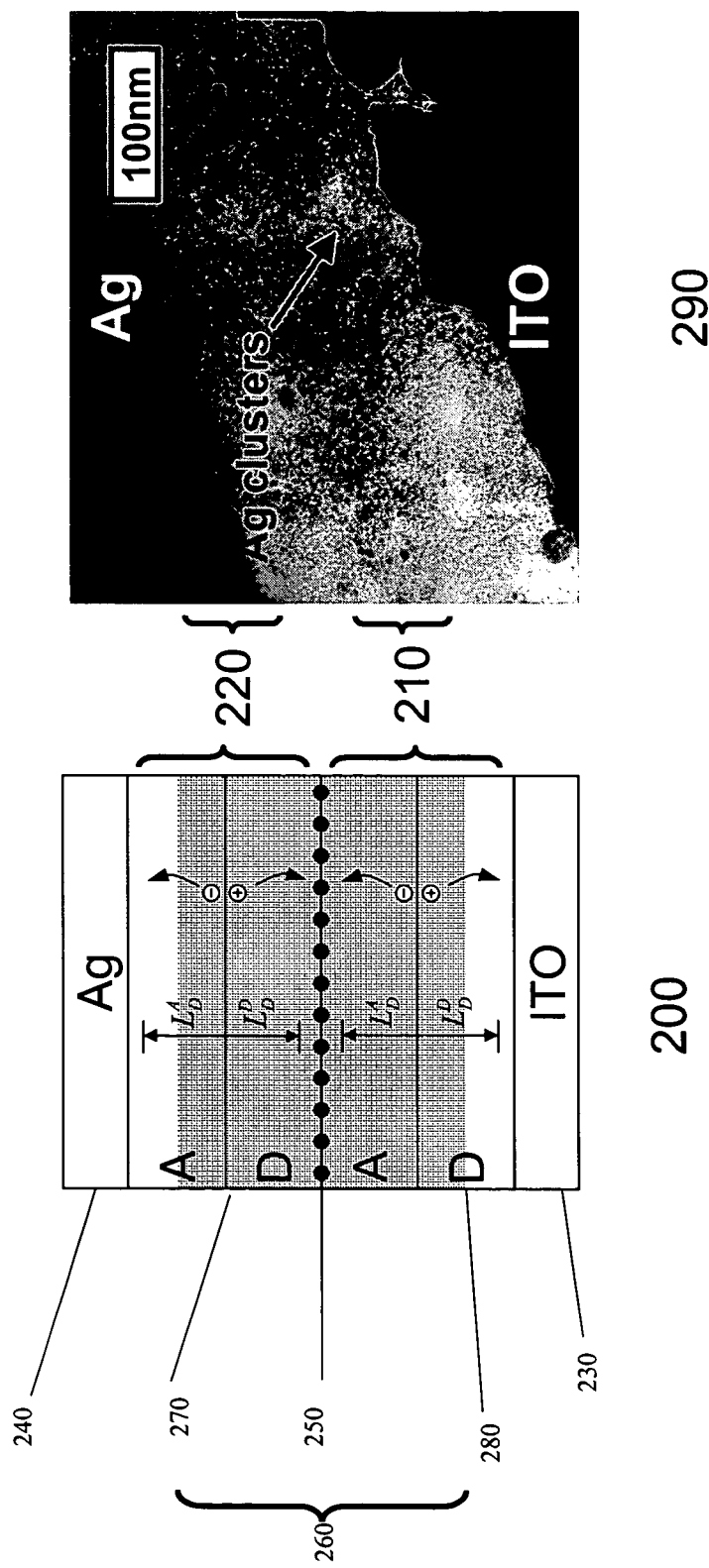
FIG. 2 shows a schematic and transmission electron micrograph of a cross-section of a tandem organic photovoltaic cell.

In tandem bilayer solar cells, each subcell may be sufficiently thin to allow for a large percentage of excitons to dissociate, while the device is thick enough to realize a high absorption efficiency. FIG. 2 shows a schematic diagram 200 and high resolution transmission electron micrograph 290 of a cross-section of a tandem organic PV cell. The two cells 210 and 220 are contacted by an indium-tin-oxide (ITO) anode 230 and a Ag cathode 240, and separated by a Ag nanoparticle layer 250. As used herein, the term "nanoparticle" refers to a particle that fits within and/or between the organic layers of an organic device. A preferred nanoparticle size is about 300 Å or less, although the nanoparticles may be encapsulated within other materials that may increase this size. The enhancement distance and diffusion lengths, $L_D^D$ and $L_D^A$ of the donor (D) layer and acceptor (A) layer of each device are labeled. Ag clusters are visible in the micrograph, and are shown (filled circles) in the schematic. The schematic shows a representation of current generation in the tandem cell. Upon light absorption, excitons are formed in both photovoltaic subcells 210 and 220. After dissociation at a DA interface 270 or 280, the hole in PV subcell 210 and electron in PV subcell 220 are collected at the adjacent electrodes 230 and 240. To prevent build-up of charge within the cells, the electron in PV subcell 210 and hole in PV subcell 220 diffuse to the metal nanoparticle layer 250 where they recombine. The attraction of the initial charge to the nanoparticle is primarily a result of image charge effects. Once the metal particle is singly charged, Coulomb attraction of the free counter charge leads to rapid recombination at the Ag surface 250.

This series-connected tandem cell structure is advantageous because it leads to an increase of the open circuit voltage, $V_{OC}$, compared with the single bilayer cell case. Given that $\eta_P = J_{SC} V_{OC} FF/P_{inc}$ (where $J_{SC}$ is the short-circuit current density, FF is the fill factor, and $P_{inc}$ is the incident optical power density), this can lead to an increase in $\eta_P$, given that the other parameters remain unchanged. The challenge to realizing tandem cells is therefore in balancing the photocurrent from each cell as the current in the device is limited by the smaller of the two currents produced in PV subcell 210 or PV subcell 220. This can be accomplished by varying the thicknesses or the material compositions of the various device layers, but becomes complicated due to optical interference effects. Series tandem cells may also comprise multiple subcells electrically connectected, including more than two subcells, where each subcell comprises an acceptor layer and a donor layer. Other arrangements of subcells may be utilized, as would be apparent to one having skill in the art.

In addition to functioning as an efficient carrier recombination layer to prevent cell charging, nanoparticles can also enhance the incident electric field, which in turn can increase absorption in the nearby organic thin film. The shaded area 260 in the diagram of FIG. 2 indicates the region where the electric field is influenced by the Ag nanoparticles 250. The field enhancement results from surface plasmon polariton (SPP) resonances optically excited on the nanoparticle surfaces. As used herein, and as would generally be understood by one skilled in the art, "surface plasmon polariton resonance" refers to the coupling of the incident photons to the plasma oscillation of the particle surfaces, where "plasma oscillation" refers to the collective excitation of conduction electrons in the particle. The SPP resonance originates from the displacement of the negative conduction electrons against the positively charged background due to an applied electric field. This results in polarization charges at the nanoparticle surface, which leads to a restoring force and thus a resonance eigenfrequency. This property of metal nanoparticles m,ay also be applied to both Schottky and dye-sensitized PV cells, where the photoactive region is in contact with the nanoparticle layer.

The SPP resonance position of nanoparticles or aggregates of nanoparticles may be influenced by irregular particle shapes, different embedding dielectric media and substrate effects, and interparticle coupling. Taking advantage of these various effects, the resonance of a nanoparticle or nanoparticle array may be tuned to wavelengths within the visible and infrared spectrum.

Since the SPP resonance enhances the local electromagnetic field, the nanoparticle and the photoactive region do not need to be in direct contact to realize the benefits of the SPP resonance. In one embodiment of the invention, encapsulated nanoparticles are dispersed within an active organic region disposed between two electrodes. The nanoparticles may be distributed randomly or uniformly throughout the region. Other arrangements of the nanoparticles are also possible and may be advantageous for specific applications. In a preferred embodiment of the invention, the photoactive region comprises one or more PV cells. In this embodiment the encapsulated nanoparticles may be disposed in planar layers between adjacent PV cells. The photoactive region may comprise other suitable organic material, including dye-sensitized materials. Dispersing the nanoparticles within the photoactive region enhances the electric field incident on the surrounding region due to SPP resonances on the particle surfaces. The nanoparticles are preferably comprised of a metal, with Ag, Cu, and Au being particularly preferred. The use of these materials provides an SPP resonance that results in increased absorption at visible wavelengths. The nanoparticles may also be comprised of a doped degenerative semiconductor or other semiconductive material.

Figure 3:
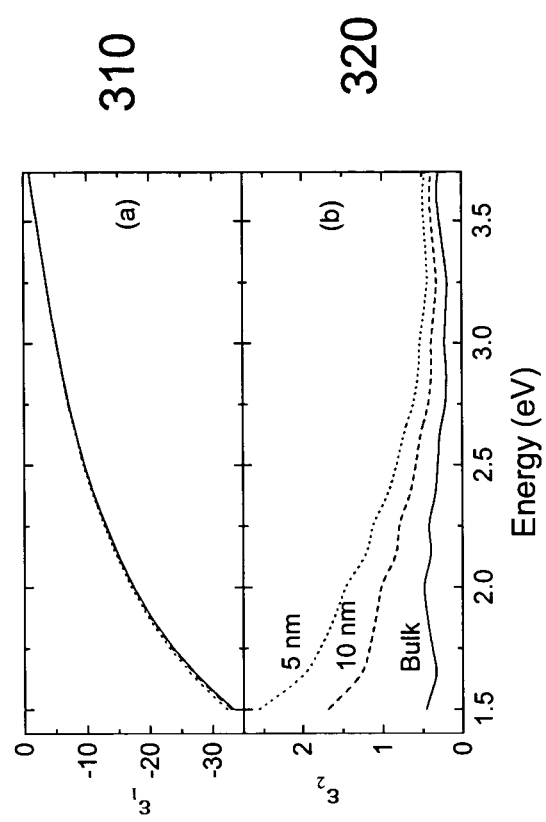
FIG. 3 shows the real ($\epsilon_1$) and imaginary ($\epsilon_2$) dielectric functions for Ag calculated as functions of photon energy.
Figure 4:
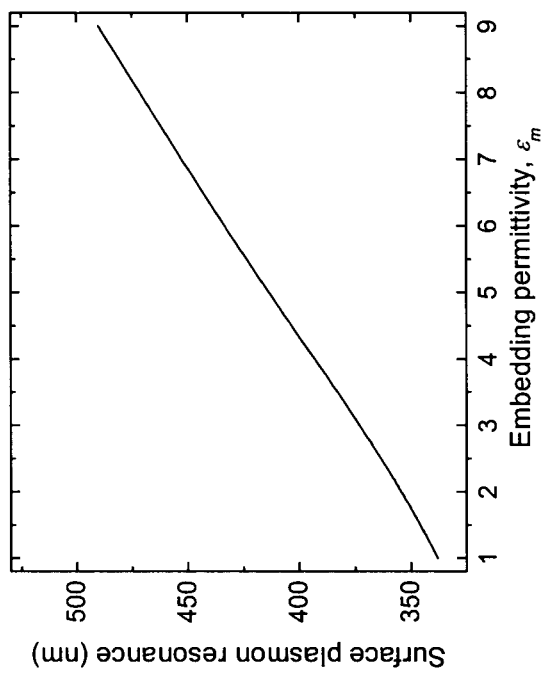
FIG. 4 shows simulated surface plasmon polariton (SPP) resonance wavelength for a 5 nm spherical Ag particle as a function of the dielectric function, $\epsilon_m$, of the embedding medium.

The resonance wavelength occurs when the following expression is minimized:

$$[\epsilon_1(\omega)+2\epsilon_m(\omega)]^2+\epsilon_2(\omega)^2=\text{constant}$$

where $\epsilon_1(\omega)$ and $\epsilon_2(\omega)$ are for the metal, and $\epsilon_m(\omega)$ for the embedding medium. This can be simplified to $\epsilon_1(\omega) = -2\epsilon_m(\omega)$ given that $\epsilon_2(\omega)$ or $\partial\epsilon_2/\partial\omega$ are small, which is typically true for, for example, Ag, in the region of resonance from 3.0 to 3.5 eV. FIG. 3 shows the real dielectric function 310 and imaginary dielectric function 320 for Ag as functions of photon energy. Bulk Ag is shown as a solid line and 10 nm (dashed line) and 5 nm (dotted line) diameter Ag clusters are also shown. FIG. 4 shows the effect of the embedding medium on the SPP resonance of 2R=5 nm nanoparticle of Ag, where changes in the dielectric function have been taken into account. Dashed lines indicate resonance wavelengths for a particle with an axial ratio of b/a=0.6. Inset shows the geometry of the simulation.

Figure 5:
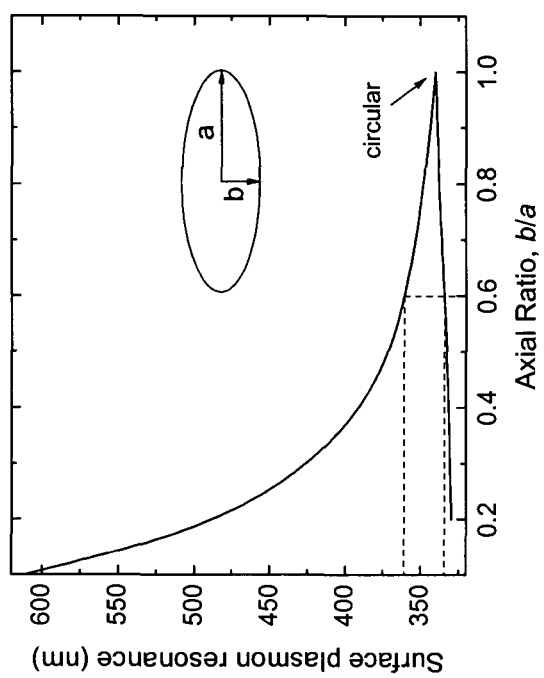
FIG. 5 shows simulated SPP resonance wavelength versus axial ratio for a Ag particle in vacuum.

The shape of a nanoparticle is another factor that may particularly affect the SPP resonance. For example, for elliptical nanoparticles, the SPP may split into two modes, one corresponding to the long axis a, and the other to the short axis b of the spheroid. In FIG. 5, the SPP peak position for an elliptical nanoparticle in vacuum is shown. As used herein, the term "axial ratio" refers to the ratio of the shortest axis to the longest axis, i.e., b/a. For small values of the axial ratio, the wavelength spacing between the two resonance peaks reaches values of 300 nm, and for b/a=1, the SPP position corresponds to that of a spherical nanoparticle in vacuum at $\lambda_p$=338 nm. For example, the dashed lines in FIG. 5 show that an axial ratio of 0.6 leads to SPP modes at $\lambda_b$=334 and $\lambda_a$=360 nm. This splitting of dipole modes can be generalized to cases of any nonspherical particle shape, due to the resulting distribution of charge in the asymmetric nanoparticle. In preferred embodiments of the invention, the nanoparticles have a smallest axis not greater than about 300 Å, and an axial ratio of not less than about 0.1. For more spherical particles (i.e., those with an axial ratio of about 1), it is preferred that the average surface-to-surface separation be not more than about 100 Å. Larger particle sizes and/or smaller average separations decrease the amount of organic material available for absorption, which may decrease the enhancement of the incident optical field due to SPP resonances. However, for some purposes other dimensions other than those specifically described may be used. It is further preferred that the nanoparticles be non-spherical, and be disposed with longest axes parallel to an interface. It is believed that such an arrangement increases the enhancement to the incident optical field resulting from dipole interactions and SPP resonances of the nanoparticles. For nonspherical particles (those with an axial ratio of less than 1), interparticle coupling may be less influential in local field enhancements. It is therefore preferred that the average surface-to-surface separation of nonspherical particles be not more than about 300 Å. Other arrangements and separations may be used for some purposes. In some cases, encapsulated nanoparticles may comprise a significant percentage of the volume of the active region.

For PV cell applications, it is advantageous to introduce field enhancement over the full range of the solar spectrum which overlaps the absorption spectra of the photoactive materials. The spectral dependence of absorbance will now be discussed.

Figure 6:
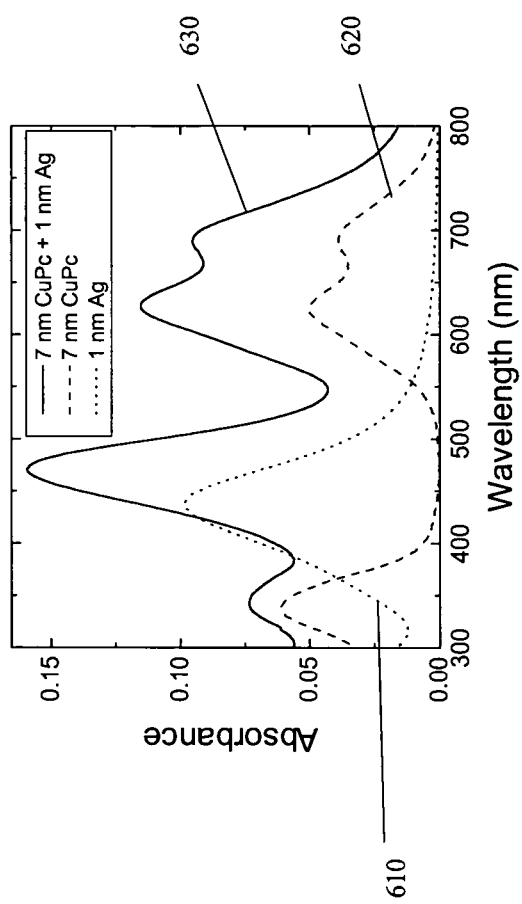
FIG. 6 shows absorbance spectra for 1 nm Ag (dotted curve), 7 nm CuPc (dashed curve), and 7 nm CuPc film on 1 nm Ag (solid curve) deposited on quartz substrates.

FIG. 6 shows representative measured absorption spectra for three films on quartz with and without nanoparticles. The nanoparticles in the 1 nm thick Ag layer have a mean diameter of about 2R=5 nm, and center-to-center spacing of about d=10 nm. The curve 610 for a 10 Å thick Ag island film has a 100 nm peak (full width at half maximum) centered at a wavelength of $\lambda_p$=440 nm due to surface plasmon excitation of the nanoparticles. The peak position and intensity are indicative of a distribution in particle shape and size, as well as the dipolar coupling between nanoparticles that broadens the optical response with decreasing particle spacing. Absorption of a 7 nm thick film of CuPc (curve 620) and a 7 nm CuPc film deposited on top of the 1 nm coverage thickness Ag island film (curve 630) are also shown. The plasmon peak of the Ag nanoparticle layer is red-shifted by 30 nm to $\lambda_p$=470 nm due to the presence of the surrounding CuPc dielectric, although the positions of the CuPc peaks at $\lambda_c$=625 nm and 690 nm are not changed. The most noticeable feature, however, is the increase of CuPc absorption at wavelengths $\lambda$>470 nm. This broadband, nonresonant enhancement may lead to an approximately 15% increase in the efficiency of tandem PV cells over that expected simply by combining the efficiencies of several stacked CuPc/PTCBI bilayers.

Enhancement may occur below the surface plasmon frequency, $\omega_p$. Below $\omega_p$, a collection of randomly distributed nanoparticles may generate "hot-spots" in the electric field due to interparticle dipole interactions, whereas the absorption of the nanoparticle film is due to dipolar plasmon modes formed on the particle surfaces.

Figure 7:
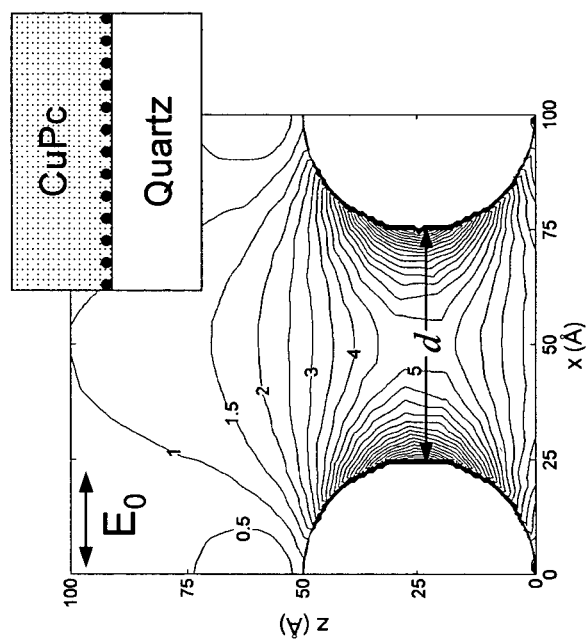
FIG. 7 shows a contour map of the calculated intensity enhancement ($I/I_0$) of a chain of Ag particles with diameter 2R=5 nm and center-to-center spacing d=10 nm at λ=690 nm.

FIG. 7 shows a representative field distribution for a planar array of Ag cylinders, on a quartz substrate surrounded by a CuPc dielectric, with diameter 2R=5 nm and a uniform surface-to-surface spacing $\delta$=5 nm. The particles lie on a quartz substrate (n=1.46, z=0) and are embedded in a dielectric medium (CuPc). Contour labels represent the calculated intensity enhancement and are spaced by 0.5. The polarization vector is indicated by the arrow, and propagation is in the +z direction. The field distribution is for an excitation wavelength of $\lambda$=690 nm and polarization parallel to the nanoparticle chain. The contours indicate the intensity enhancement of the electric field, $(I/I_0)$, where I is the local field intensity, and $I_0$ is the intensity of the incident field. These intensities are proportional to $|\overline{E}|^2$ and $|\overline{E}_0|^2$, respectively, where $\overline{E}$ is the local field amplitude, and $\overline{E}_0$ is the amplitude of the incident field. Twelve-fold intensity enhancements may be found in the interstices of the cylinders. The dipolar nature of the field intensity is evident, with field attenuation found in the "shadow" of the sphere.

Figure 8:
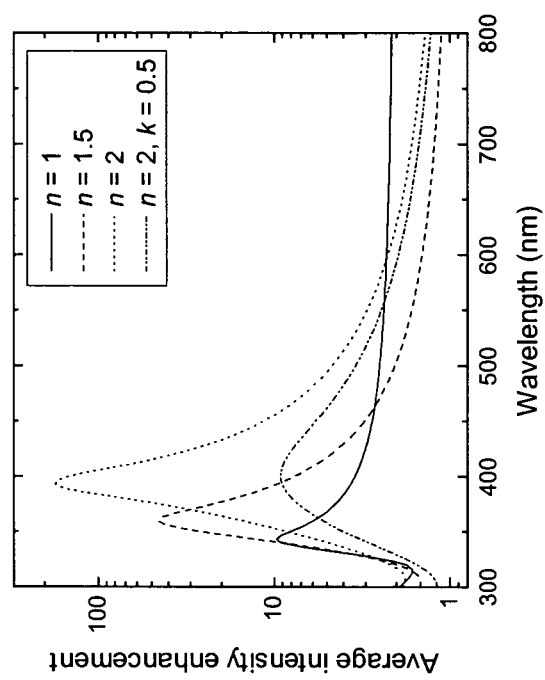
FIG. 8 shows average calculated intensity enhancement ($I/I_0$) on the surface of a 5 nm diameter Ag particle as a function of wavelength for different embedding media.

The effect of the embedding medium on the position of the SPP resonance and also on the spectral bandwidth of the enhancement is of particular importance to application to solar cells, where enhancing a wide range of wavelengths is of interest. FIG. 8 shows the intensity enhancement of an incident field integrated over the surface of a single, 2R=5 nm spherical particle. The resonance peak red shifts as a result of the increasing dielectric constant of the embedding medium. As n is increased from 1 to 2, the resonance peak becomes stronger, while the extent of the enhancement plateau at the long wavelength side of the SPP peak is reduced. Embedding the particle in a material with $\overline{n}$=2+0.5i, a value typical for a strongly absorbing organic thin film, causes the dipole SPP peak to be suppressed by over an order of magnitude compared with a non-absorbing dielectric.

Figure 9:
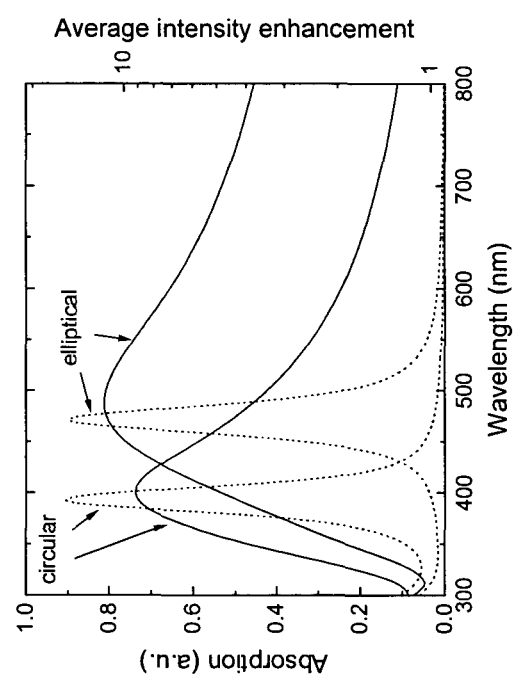
FIG. 9 shows absorption (dotted lines) and average intensity enhancement ($I/I_0$) (solid lines) simulated on the surface of a 5 nm diameter spherical and elliptical particle (axial ratio of 0.5).

FIG. 9 shows the spectra of a spherical (2R=5 nm) and a b/a=0.5 elliptical nanoparticle of area equal to the spherical nanoparticle embedded in a dielectric with $\overline{n}$=2+0.5i. Both particles have the same area, and are embedded in a dielectric with $\overline{n}$=2+0.5i. The absorption (dotted lines) of the elliptical nanoparticle peaks at $\lambda$=470 nm, and is red-shifted from that of the spherical one at $\lambda$=392 nm. Polarization of the incident light is parallel to the long axis of the elliptical particle, and therefore that mode is excited. The elliptical particle has a red-shifted enhancement tail that extends beyond the absorption of most organic PV materials, making this shape of particle better suited for use in organic PV cells.

Figure 10:
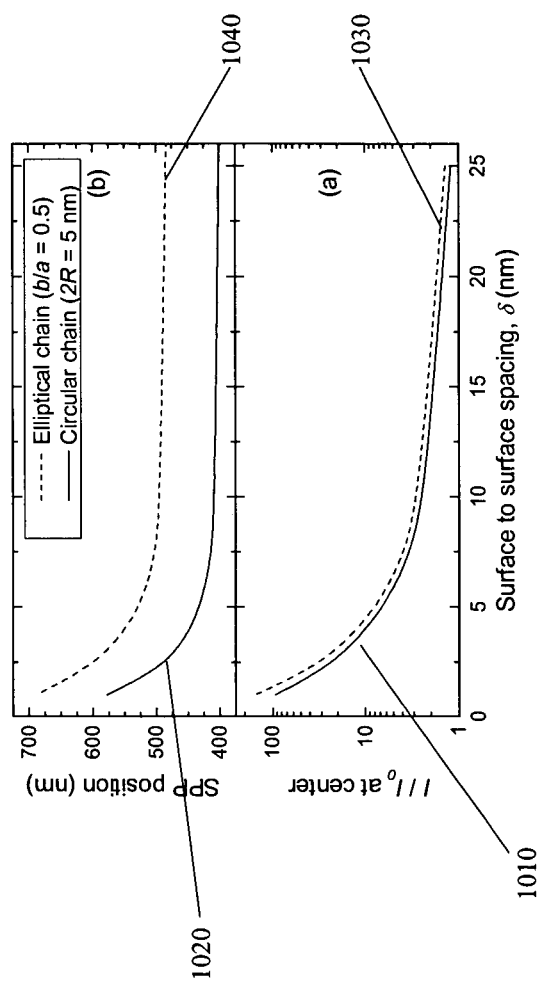
FIG. 10 shows (a) maximum calculated intensity enhancement ($I/I_0$) at the center of a 1D chain of particles versus δ; and (b) simulated surface plasmon polariton (SPP) peak wavelength as a function of the surface to surface spacing, δ, of a ID chain of 5 nm diameter spherical (solid lines) and elliptical particles (dashed lines).

The charge recombination layer in a tandem organic PV cell may consist of a thermally evaporated, random array of nanoparticles of various sizes, shapes, and spacing. FIG. 10 shows the intensity enhancement at the center of an array of spherical Ag nanoparticles 1010, 1020 and elliptical nanoparticles 1030, 1040 in a medium with $\bar{n}=2+0.5i$. For $\delta>10$ nm, the enhancement decreases monotonically with spacing, increasing rapidly for $\delta<10$ nm due to the nonlinear increase in dipolar coupling between neighboring nanoparticles. The SPP resonance position red shifts for a $\delta\le 10$ nm, whereas for larger $\delta$ the SPP resonance converges to the single particle wavelength.

Figure 11:
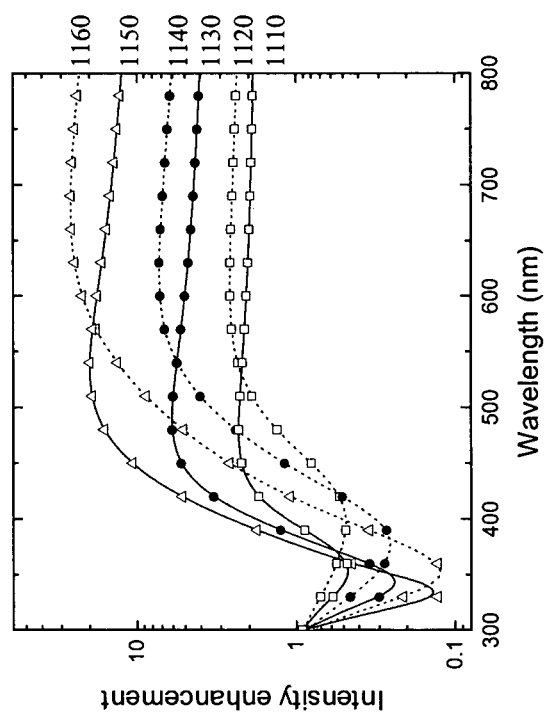
FIG. 11 shows intensity enhancement ($I/I_0$) calculated at the axis of a 1D chain of particles embedded in a $\bar{n}$=2+0.5i medium versus wavelength.

FIG. 11 shows the spectral response for $\delta=10$ nm 1110 and 1120, 5 nm 1130 and 1140, and 2.5 nm 1150 and 1160, for both spherical (solid lines) arrays 1110, 1130 and 1150, and elliptical (dotted lines) arrays 1120, 1140, and 1160. Solid lines indicate an array of 5 nm diameter clusters while dotted lines indicate elliptical particles of axial ratio 0.5 with the same area. Surface-to-surface spacings of $\delta=10$ nm (open squares), 5 nm (filled circles), and 2.5 nm (open triangles) are shown. In each case, the elliptical array has a larger maximum enhancement than for the spherical case. As $\delta$ is reduced, coupling effects are stronger than the shape effect. The enhancement plateau for these structures is wide due to interparticle coupling. Also, there is a region of attenuation at wavelengths just below the SPP resonance. The solar spectral intensity at $\lambda<350$-$400$ nm is weak and therefore this does not significantly impact device performance as compared with the improvements incurred at long wavelengths.

Figure 12:
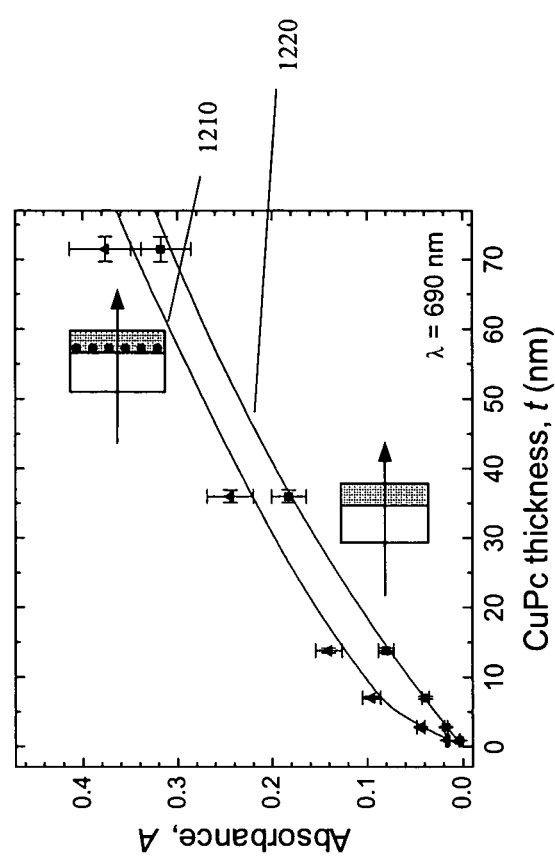
FIG. 12 shows measured absorbance, A, of varying thicknesses of CuPc on quartz at a wavelength of λ=690 nm with (triangles) and without (squares) a 10 Å Ag cluster layer. Fits (solid curves) to the data are described in the text.
Figure 13:
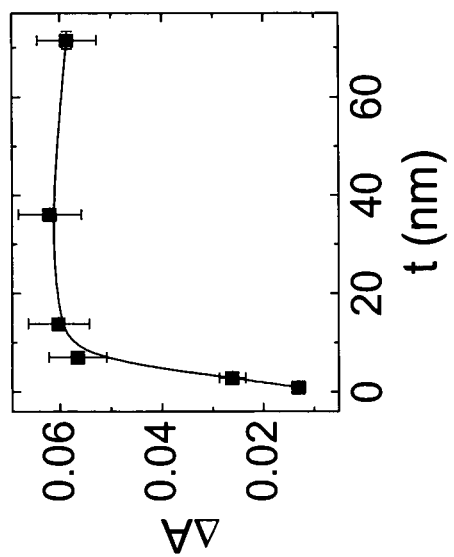
FIG. 13 shows the measured difference of the absorbance (ΔA) of the CuPc films with and without a Ag layer vs. CuPc thickness, t.

The distance over which there is enhancement from the recombination layer of a tandem organic PV cell is also of interest. FIG. 12 shows measured absorbance, A, of varying thicknesses of CuPc on quartz at a wavelength of $\lambda=690$ nm with (triangles) and without (squares) a 10 Å Ag cluster layer. The measured absorbance values of CuPc films of varying thickness (t) deposited directly onto quartz substrates, as well as onto Ag island films, at a nonresonant wavelength of $\lambda=690$ nm are shown in FIG. 12. At this wavelength, absorption due to Ag nanoparticles can be neglected, providing a direct comparison of changes in CuPc absorption. The absorbance increases more rapidly for the CuPc film adsorbed onto the Ag islands 1210 than that for the neat film 1220 when t≤10 nm. At large t, absorption is no longer enhanced. FIG. 13 shows the measured difference of the absorbance (ΔA) of the CuPc films with and without a Ag layer vs. CuPc thickness, t.

The nanometer-size Ag nanoparticle films possess scattering and reflection efficiencies approaching zero. The scattering loss from the dipole mode may only become larger than the absorption loss for particles with 2R>30 nm.

Figure 14:
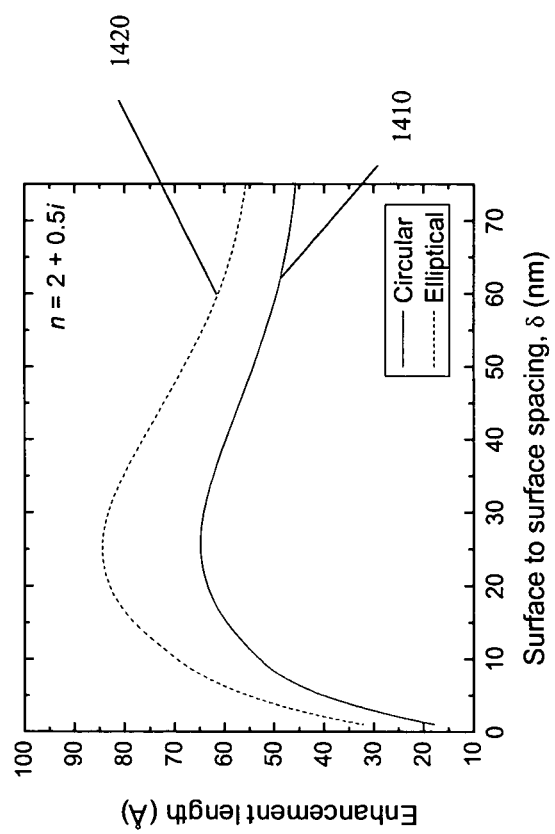
FIG. 14 shows the effective enhancement length calculated for a 1D chain of 5 nm diameter spherical (solid lines) and elliptical (axial ratio=0.5) particles (dashed lines) embedded in a dielectric with $\bar{n}$=2+0.5i as a function of the surface-to-surface spacing of particles in the chain.

FIG. 14 shows the effective thickness of a thin film dielectric region with $\bar{n}=2+0.5i$ surrounding an array of particles which is within the "enhancement zone" of that array, including the area within that array of particles. For very small $\delta$, the enhancement in the nanoparticle interstices is large, although it is primarily confined to this small region. The enhancement for spherical array 1410 and elliptical arrays 1420 peaks at about $\delta=25$ nm, extending to distances of about 7 and 9 nm, respectively.

A tandem PV cell consisting of two CuPc/PTCBI DA heterojunctions layered in series, and separated by a thin Ag nanoparticle recombination layer has a power efficiency, $\eta_P$, of about $(2.5\pm 0.1)\%$ whereas $\eta_P$ for a single CuPc/PTCBI subcell is $(1.1\pm 0.1)\%$ under 1 sun (100 mW/cm²) simulated AM1.5G (air mass 1.5 global) illumination. $V_{OC}$ for the tandem cell is about twice the single cell value. An increase in $J_{SC}$ may account for an approximately 15% increase in $\eta_P$ to 2.5%. $J_{SC}$ is found using:

$$J_{SC} = \frac{q}{hc}\int \lambda \eta_{EQE}(\lambda) S(\lambda) d\lambda, \quad (3)$$

where $S(\lambda)$ is the simulated AM1.5G solar irradiance spectrum, q is the electron charge, c is the speed of light, and h is Planck's constant.

Figure 15:
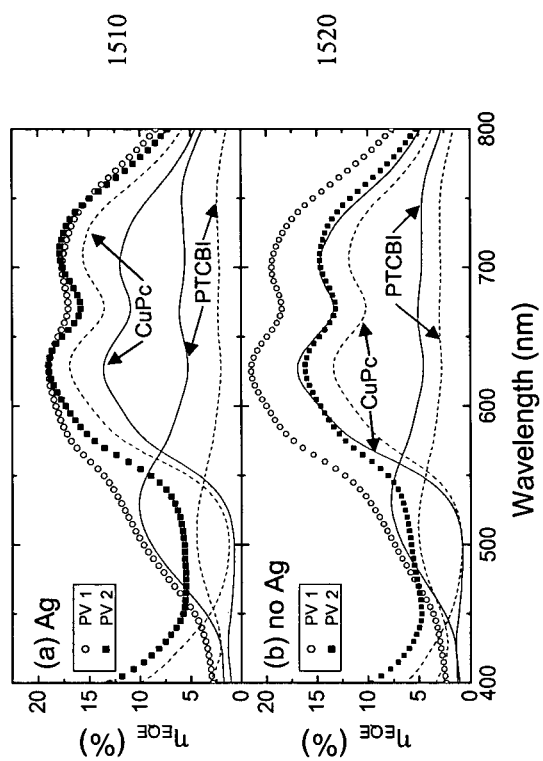
FIG. 15 shows the calculated external quantum efficiency ($\eta_{EQE}$) spectra for a CuPc/PTCBI tandem PV cell (a) with, and (b) without the presence of Ag clusters.

FIG. 15 shows $\eta_{EQE}(\lambda)$ calculated with the Ag nanoparticle layer 1510 and without the Ag nanoparticle layer 1520 for the tandem structure: 150 nm ITO/10 nm CuPc/13 nm PTCBI/1 nm Ag/13 nm CuPc/30 nm PTCBI/100 run Ag. Open circles show $\eta_{EQE}$ for the front cell (PV 1, nearest the anode) while filled squares show $\eta_{EQE}$ for the back cell (PV 2, nearest the cathode). The contributions to $\eta_{EQE}$ from the CuPc and PTCBI layers for PV 1 (solid curves) and PV 2 (dashed curves) are also shown. The back cell is thicker than the front cell to compensate for the reduction in field intensity due to absorption in the front cell as well as to parasitic optical interference effects. In the structure without Ag nanoparticles 1520, $\eta_{EQE}(\lambda)$ for PV 1 (open circles) and PV 2 (filled squares) are similar in shape, although PV 1 has a larger $J_{SC}$ due to its higher $\eta_{EQE}$ throughout most of the photoactive region. This current imbalance limits $J_{SC}$ to the smaller current in PV 2. For both PV 1 and PV 2, the principal contribution to $\eta_{EQE}(\lambda)$ is from the CuPc layer, since the diffusion length for CuPc, $L_D^{CuPc}=(100\pm 30)$ Å, is larger than that of PTCBI with $L_D^{PTCBI}=(30\pm 3)$ Å. The short circuit current density is balanced for the enhanced case, although $\eta_{EQE}(\lambda)$ for PV 1 and PV 2 have different shapes. Because of the field enhancement of the nanoparticles, there is a large contribution to $\eta_{EQE}$ from the PTCBI layer for PV 1, and from the CuPc layer for PV 2.

In the CuPc/PTCBI architecture, the small $L_D$ of these materials allows for the deposition of thin layers in the front and back cells, and hence the DA interface lies within the enhancement zone. For materials with large $L_D$, such as $C_{60}$, the current architecture does not allow for significant enhancement at the DA interface if the layer thickness is approximately $L_D$, as is the optimal layer thickness for a bilayer organic PV cell. For such materials, it may be possible to make tandem devices from co-evaporated thin films of D and A materials, where exciton dissociation is not limited by $L_D$. In this case, the PV subcells can be kept thin to preserve a high FF, while the enhancement from the nanoparticle charge recombination layer increases absorption in the cell.

The optical field intensity in the near field of a chain of metallic nanoparticles may increase by up to a factor of one hundred compared with the incident light intensity. This enhancement covers a wide spectral range, and may extend to distances of up to 100 Å, allowing for increased absorption in thin organic films placed in contact with the nanoparticles or near nanoparticles. The enhancement may result in higher power efficiencies in tandem bilayer organic PV cells.

The relatively small diffusion lengths in CuPc/PTCBI PV cells allow for thin layers with enhanced absorption at the current generating DA interface. For materials with $L_D>100$ Å, exciton quenching at the Ag nanoparticles may limit the potential for efficiency improvements via increased absorption. A possible means to prevent exciton quenching from competing with the efficiency gains is to encapsulate the metal nanoparticles in a thin insulating layer. These encapsulated nanoparticles can then be dispersed throughout the organic films, enhancing absorption without degrading the electrical efficiency of the cell. The encapsulated nanoparticles may comprise a significant percentage of the organic film volume.

Encapsulated nanoparticles may be created using layer-by-layer self-assembly, as described in Ung et al., *J. Phys. Chem.* B 2001, 105, 3441-52 and Salgueiriño-Maceira et al., *J. Phys. Chem.* B 2003, 107, 10990-10994, the Turkevich method as described in same, and other methods as described in Liz-Marzán and Mulvaney, *J. Phys. Chem.* B 2003, 107, 7312-26, all three incorporated herein by reference. Other methods of creating and encapsulating nanoparticles may be used, as will be appreciated by one skilled in the art.

Use of these encapsulated nanoparticles may allow for adjustment of particle-particle coupling effects, macroscopic properties of the host material, and other effects. In one embodiment of the invention, the nanoparticles are encapsulated within an insulating material. In a preferred embodiment of the invention, the nanoparticles are encapsulated within an oxide. It is especially preferred that the insulating layer be not less than about 10 Å and not greater than about 100 Å. Below about 10 Å, quantum effects may become non-trivial, and above about 100 Å separation of the nanoparticles may begin to dampen SPP resonance effects. The nanoparticles may not need to be in physical contact with the organic photoactive region. In another embodiment of the invention, the nanoparticles may be disposed throughout an "active zone". As used herein, "active zone" is a region slightly larger than the "photoactive region." Specifically, the "active zone" is a region from which nanoparticles can have a significant positive effect on absorption in the photoactive region. Generally, the "active zone" includes organic materials that comprise the photoactive region, as well as organic materials within about 100 Å of the photoactive region. The active zone may include non-photoactive materials, and may most commonly include, for example, blocking layers disposed adjacent to the photoactive region.

Once fabricated according to any of a variety of methods, encapsulated nanoparticles may be incorporated into a device by any suitable method. In a preferred embodiment, the nanoparticles are incorporated into a solution-deposited organic layer by suspension in the solution prior to deposition. Other methods, such as co-depositing encapsulated particles with an organic layer deposited by evaporation, may also be used. The orientation of such nanoparticles (where the particles are non-spherical) may be controlled through mechanical means, such as spin-coating, and/or by the application of a field, such as a magnetic or electrical field, during the deposition process. In some embodiments, the encapsulated nanoparticles may be fabricated in-situ.

Although the present invention is described with respect to particular examples and preferred embodiments, it is understood that the present invention is not limited to these examples and embodiments. The present invention as claimed may therefore include variations from the particular examples and preferred embodiments described herein, as will be apparent to one of skill in the art.

What is claimed is:

1. A device comprising:
   a first electrode;
   a second electrode;
   a photoactive region comprising a first donor layer and a first acceptor layer, wherein each of the first donor layer and the first acceptor layer is an organic material, disposed between and electrically connected to the first electrode and the second electrode; and
   a plurality of nanoparticles consisting of a core and an insulating encapsulation layer, wherein the core is comprised of a metal, doped degenerative semiconductor or semiconductive material, said encapsulated nanoparticles dispersed within said photoactive region wherein the nanoparticles have a plasmon resonance and said photoactive region generates excitons by absorbing electromagnetic radiation when said device is exposed to electromagnetic radiation,
   wherein said insulating material encapsulating the nanoparticles prevents quenching of the excitons at the nanoparticles.

2. The device of claim 1 wherein the nanoparticles are encapsulated within an oxide.

3. The device of claim 1 wherein the photoactive region comprises a first subcell, the first subcell comprising:
   the first donor layer; and
   the first acceptor layer in direct physical contact with the first donor layer.

4. The device of claim 3 wherein the photoactive region further comprises a second subcell, the second subcell further comprising:
   a second donor layer; and
   a second acceptor layer in direct physical contact with the first donor layer, wherein the second subcell is disposed between the first subcell and the second electrode.

5. The device of claim 3 wherein the nanoparticles are disposed within the first acceptor layer and the first donor layer.

6. The device of claim 4 wherein the nanoparticles are disposed between the first subcell and the second subcell.

7. The device of claim 1 wherein the nanoparticles are non-spherical.

8. The device of claim 7 wherein the photoactive region is planar thereby defining a plane, and the non-spherical nanoparticles having a longest axis and a shortest axis wherein the longest axis of each non-spherical nanoparticle is about parallel to the plane.

9. The device of claim 7 wherein each of the non-spherical nanoparticles has an axial ratio not less than about 0.1.

10. The device of claim 1 wherein an average surface-to-surface separation between nanoparticles is not greater than about 300 Å.

11. The device of claim 8 wherein the shortest axis of each non-spherical nanoparticle is not greater than about 300 Å.

12. The device of claim 2 wherein the thickness of the insulating material is not less than about 10 Å.

13. The device of claim 2 wherein the thickness of the insulating material is not greater than about 100 Å.

14. The device of claim 1 wherein the metal is Ag.

15. The device of claim 1 wherein the metal is Au.

16. The device of claim 1 wherein the metal is Cu.

17. The device of claim 1 wherein the photoactive region comprises a bulk heterojunction.

18. The device of claim 1 wherein the photoactive region comprises a dye-sensitized material.

19. A device comprising:
   a first electrode;
   a second electrode;
   an active zone disposed between and electrically connected to the first electrode and the second electrode, the active zone comprising:
      a photoactive region disposed within the active zone and disposed between and electrically connected to the first electrode and the second electrode, said photoactive region comprising a first donor layer and a first acceptor layer, wherein each of the first donor layer and the first acceptor layer is an organic material; and
      additional organic materials disposed within 100 Å of the photoactive region; and
   a plurality of nanoparticles consisting of a core and an insulating encapsulation layer, wherein the core is comprised of a metal, doped degenerative semiconductor or semiconductive material, said encapsulated nanoparticles dispersed within said photoactive region, wherein the nanoparticles have a plasmon resonance and said photoactive region generates excitons by absorbing electromagnetic radiation when said device is exposed to electromagnetic radiation and said insulating material encapsulating the nanoparticles prevent quenching of the excitons at the nanoparticles.

20. The device of claim 19, wherein the active zone further comprises an organic exciton blocking layer disposed adjacent to the photoactive region.

21. A method for fabricating a device, comprising:
obtaining nanoparticles consisting of a core and an insulating encapsulation layer, wherein the core is comprised of a metal, doped degenerative semiconductor or semiconductive material;

fabricating a first electrode;

fabricating an organic photoactive region comprising a first donor layer and a first acceptor layer; and fabricating a second electrode, wherein each of the first donor layer and the first acceptor layer is an organic photoactive material disposed between and electrically connected to the first electrode and the second electrode, wherein the encapsulated nanoparticles are dispersed within said photoactive region.

22. The method of claim 21, further comprising a method of depositing the photoactive region by a solution process, wherein the nanoparticles are dispersed within the solution comprising the organic photoactive materials.

23. The method of claim 21, wherein the encapsulated particles are co-deposited with the organic photoactive material by evaporation.

* * * * *